(12) United States Patent
Miller et al.

(10) Patent No.: US 7,407,851 B2
(45) Date of Patent: Aug. 5, 2008

(54) DMOS DEVICE WITH SEALED CHANNEL PROCESSING

(76) Inventors: Gayle W. Miller, 140 Beckwith Dr., Colorado Springs, CO (US) 80906; Irwin D. Rathbun, 130 Pointer Pl., Colorado Springs, CO (US) 80911; Stefan Schwantes, Rombachstr. 19, Heilbronn (DE) 74080; Michael Graf, Im Seidenbaumle 35, Leutenbach (DE) 71397; Volker Dudek, Kelterstrasse 51/1, Brackenheim (DE) 74336

(*) Notice: Subject to any disclaimer, the term of this patent is extended or adjusted under 35 U.S.C. 154(b) by 315 days.

(21) Appl. No.: 11/386,316

(22) Filed: Mar. 22, 2006

(65) Prior Publication Data

US 2007/0221965 A1 Sep. 27, 2007

(51) Int. Cl.
*H01L 21/8238* (2006.01)
*H01L 21/38* (2006.01)

(52) U.S. Cl. ............ 438/220; 438/527; 438/551; 438/555

(58) Field of Classification Search .......... 438/262, 438/232, 231, 282, 305, 306, 308, 197, 220, 438/223, 224, 227, 228, 356, 357, 414, 546, 438/551, 552, 401; 257/510, 288
See application file for complete search history.

(56) References Cited

U.S. PATENT DOCUMENTS 4,558,508 A * 12/1985 Kinney et al. ............ 438/401
5,523,247 A * 6/1996 Wright .................... 438/443
5,770,492 A * 6/1998 Kapoor ................... 438/199
6,017,787 A * 1/2000 Chittipeddi et al. ........ 438/228
6,133,095 A * 10/2000 Eitan et al. ............... 438/261
6,399,446 B1 * 6/2002 Rangarajan et al. ........ 438/262
6,586,296 B1 * 7/2003 Watt ...................... 438/224
2004/0033678 A1   2/2004 Arghavani et al. ........ 438/510
2005/0051838 A1 * 3/2005 Roizin et al. ............. 257/324
2006/0035418 A1 * 2/2006 Yoshida et al. ........... 438/149

* cited by examiner

*Primary Examiner*—Uyen-Chau N. Le
*Assistant Examiner*—Eva Montalvo
(74) *Attorney, Agent, or Firm*—Schwegman, Lundberg & Woessner P.A.

(57) ABSTRACT

A method of fabricating an electronic device and a resulting electronic device. The method includes forming a pad oxide layer on a substrate, forming a silicon nitride layer over the pad oxide layer, and forming a top oxide layer over the silicon nitride layer. A first dopant region is then formed in a first portion of the substrate. A first portion of the top oxide layer is removed; a remaining portion of the top oxide layer is used to align a second dopant mask and a second dopant region is formed. An annealing step drives-in the dopants but oxygen diffusion to the substrate is limited by the silicon nitride layer; the silicon nitride layer thereby assures that the uppermost surface of the silicon is substantially planar in an area proximate to the dopant regions after the annealing step.

30 Claims, 9 Drawing Sheets

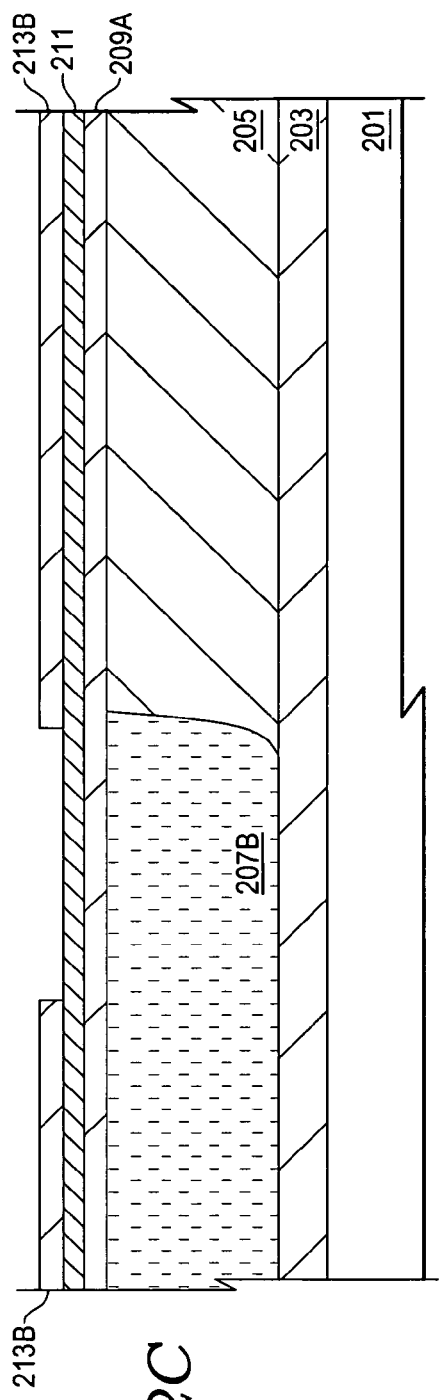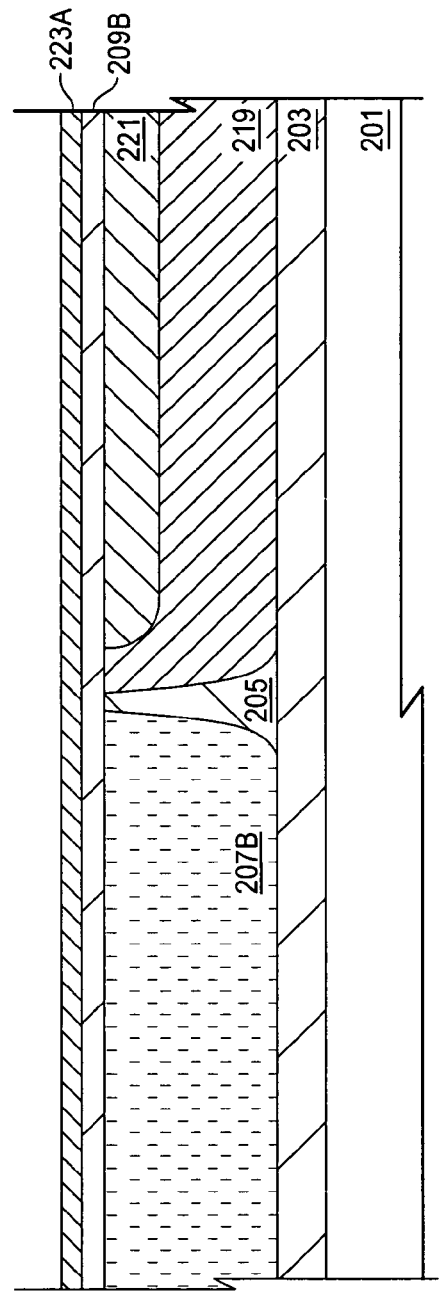

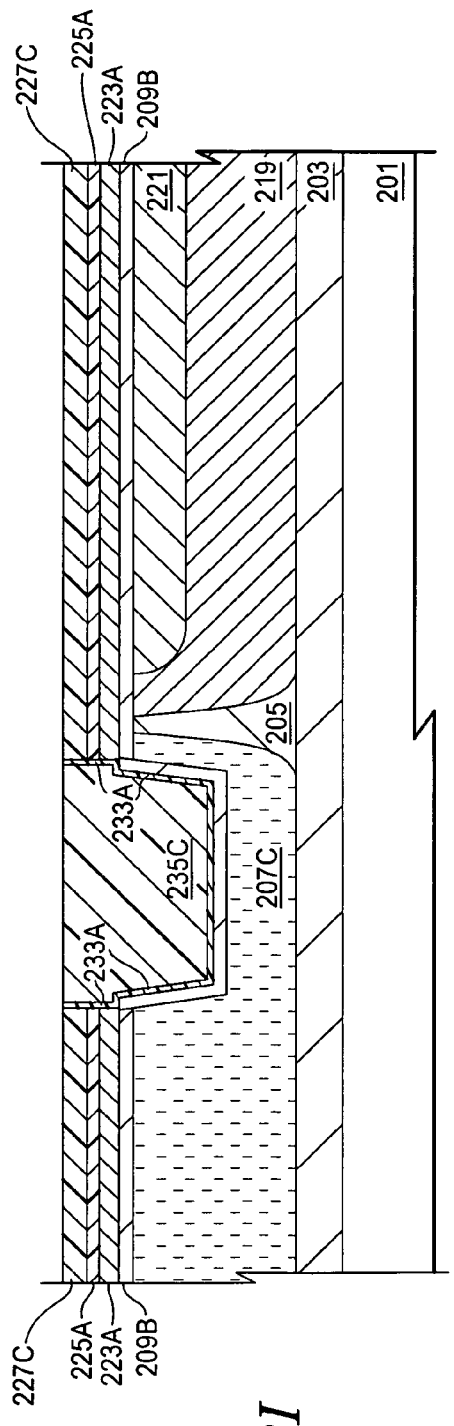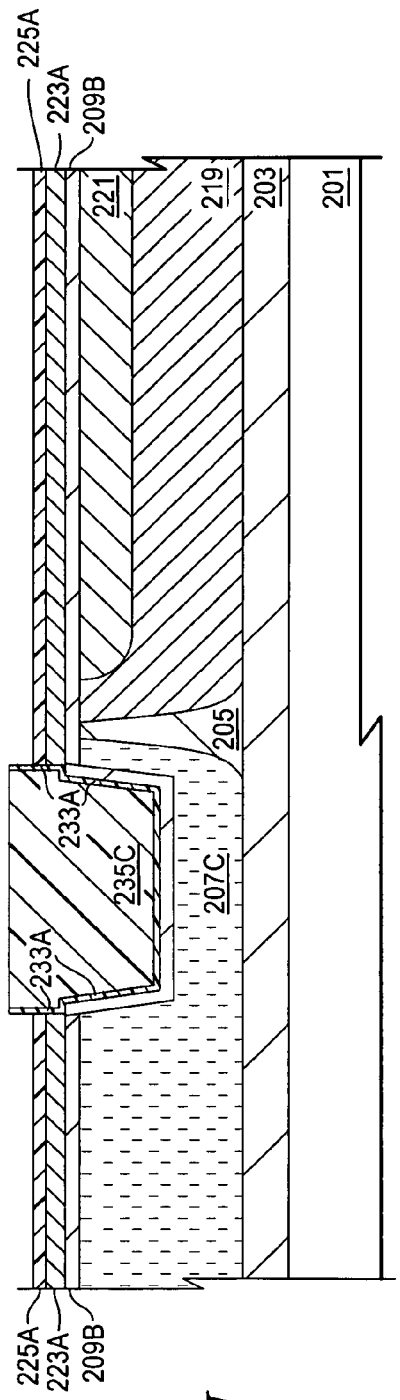

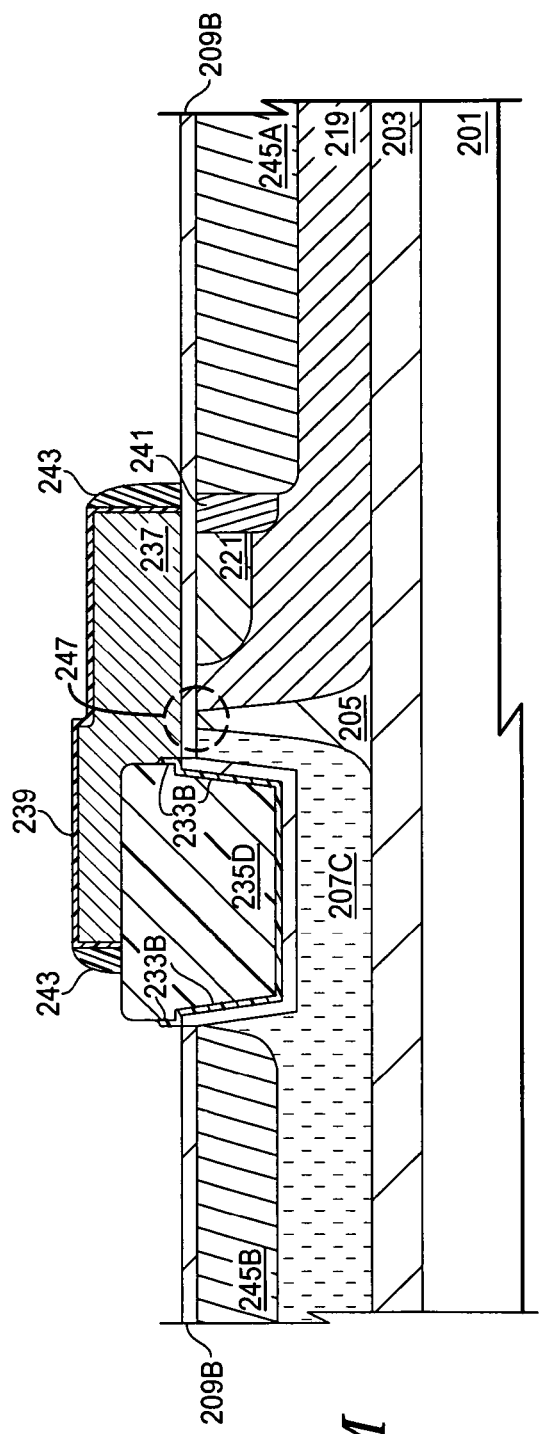
Fig._2M

DMOS DEVICE WITH SEALED CHANNEL PROCESSING

TECHNICAL FIELD

The invention relates to electronic semiconductor devices and methods of fabrication, and, more particularly, to semiconductor devices and fabrication methods thereof for reducing or eliminating silicon steps in channel regions of MOS devices by using sealing layer techniques.

BACKGROUND ART

The electronics industry continues to rely upon advances in semiconductor technology to realize higher-functioning devices in more compact areas. For many applications, realizing higher-functioning devices requires integrating a large number of electronic devices into a single integrated circuit die. As the number of electronic devices per given area of a semiconductor wafer increases, manufacturing processes employed become more difficult.

An important subject of ongoing research in the semiconductor industry is a reduction in the dimensions of devices used in integrated circuits. Planar transistors such as metal oxide semiconductor (MOS) transistors are particularly suited to use in high density integrated circuits. As a size of MOS transistors and other active devices decreases, dimensions of source/drain/gate electrodes, and a channel region of each device, must decrease commensurately.

A MOS transistor suitable to control the gating and amplification of high speed signals must have a low parasitic capacitance, low parasitic resistance, and a breakdown voltage larger than the signals which are carried. These performance parameters represent design trade-offs well known to those skilled in the art of MOS transistor fabrication.

When fabricating MOS transistors, source and drain electrodes are typically heavily doped to reduce a parasitic resistance of the device. While doping improves conductance, it concurrently increases parasitic capacitance and lowers breakdown voltages. Many prior art devices interpose lightly doped drain (LDD) regions on either side of the channel region (i.e., between the channel region and the source/drain electrodes). LDD regions permit MOS devices to develop adequate breakdown voltages. However, LDD regions also increase the resistance between the source and drain when the transistor is turned on. This increased parasitic resistance degrades the switching speed and current carrying capabilities of the transistor. The necessity of LDD regions also adds process steps to fabrication which negatively affect cost, reliability, and device size.

Most prior art MOS transistors have channel regions that are substantially the same size as an overlying gate electrode. The channel region size and shape is a direct result of implanting dopants in silicon underlying the gate electrode to form source/drain electrodes and LDD regions, after the deposition of the gate electrode. The wide channel region formed in such a process contributes undesirable characteristics to a transistor's performance. It is commonly acknowledged that the drain current is inversely proportional to the length of the channel.

DDMOS (double diffused metal oxide semiconductor) transistors are well known as a type of MOSFET using diffusions to form the transistor regions, with a typical application being as a power transistor. Such devices enjoy widespread use in such applications such as automobile electrical systems, power supplies, and power management applications.

In a DDMOS transistor, a channel length is determined by the higher rate of diffusion of the P body region dopant (typically boron) compared to the N+ source region dopant (typically arsenic or phosphorus). The channel, as defined by the body region, overlies a lightly doped drift region. DDMOS transistors can have very short channels and typically may not depend exclusively on photolithography to determine channel length. Such DDMOS transistors have good punch-through control because of the heavily doped P body shield. The lightly doped drift region minimizes the voltage drop across the channel region by maintaining a uniform electric field to achieve a velocity saturation. The field near the drain region is the same as in the drift region so that avalanche breakdown, multiplication, and oxide charging effects are lessened as compared to conventional MOSFETs.

In another type of DMOS transistor, a trench is used to form a gate structure. These transistor devices are typically formed on <100> oriented silicon substrates (wafers), using an anisotropic etch to form the trench. When etched into <100> silicon, the trench has 54.7 degree sidewall slopes. A doping distribution is the same as the DDMOS transistor described supra. One channel is located on either side of the etched trench. The device has a common drain contact at the bottom portion of the substrate. Since many devices can be connected in parallel, DMOS transistors can handle high current and high power so are suitable for power switching applications as described previously.

In fabricating these various prior art devices, many different processes have been used over the years. These processes are generally deep diffusion processes. It is well known to form such transistors having a trench in the substrate, the trench being lined with a thin oxide layer and filled with a conductive polysilicon to form the transistor gate structure. However, many of the electrical properties of the device can be adversely affected by physical surface discontinuities in the region of the channel.

With reference to FIG. 1A, a cross-sectional view of a prior art MOS device 100A includes a silicon substrate 101, an oxide isolation layer 103, a silicon-on-insulator (SOI) layer 105, an implanted nwell 107A, and a partially etched chemical vapor deposition (CVD) deposited oxide layer 109A. The oxide layer 109A is produced by methods well known in the art. The oxide layer 109A is an implant mask used to locate the implanted nwell 107A in areas only where the oxide layer 109A is thin (i.e., the thinner portion of the oxide layer 109A is an implantation window); the thicker portions of the oxide layer 109A prevent dopant material diffusion. After the implant step, a drive-in (i.e., anneal) step further diffuses the implanted dopant material deeper into the SOI layer 105 and reduces lattice damage of the silicon caused by implantation. The drive-in step requires the MOS device 100A to be subjected to an elevated temperature (e.g., 1100° C. or more). As a result of the elevated temperature, additional thermally-grown silicon dioxide is formed at an interface of the oxide layer 109A/SOI layer 105. Thermal growth techniques combine oxygen with underlying silicon (i.e., the SOI layer 105). Mechanisms for thermal oxide growth are well understood with 44% of the underlying SOI layer 105 being consumed to form the added silicon dioxide. Since the thermally-grown oxide results from oxygen diffusing through the overlying and already existing oxide layer 109A, the oxide grows much faster in the thin portions of the oxide layer 109A. The faster growth causes silicon underlying the implant window to be consumed at a faster rate as well. The increased silicon consumption produces a silicon step 111 resulting in a non-planar surface of the SOI layer 105.

FIG. 1B, indicating a portion of a nearly completed MOS device 100B, includes a driven-in nwell 107B, a planarized oxide layer 109B, an implanted pwell 113, a threshold enhancing implant region 115, an n-type lightly doped drain (NLDD) implant region 117, and a polysilicon layer 119. FIG. 1B highlights the fact that the silicon step 111 remains throughout all subsequent processing steps. Various electrical properties of the MOS device 100B are degraded as a result of the surface of the SOI layer 105 not being uniform in thickness. Even more detrimentally to device performance, contemporary fabrication techniques produce the silicon step 111 precisely in the channel region of the MOS device 100B.

Therefore, what is needed is an economical and effective method to produce an MOS device while eliminating the deleterious electrical effects of surface discontinuities produced during processing.

SUMMARY OF THE INVENTION

Due to a desire to eliminate the aforementioned deleterious physical attributes caused by contemporaneous processing methods, the present invention is, inter alia, capable of preventing a discontinuous, non-planar surface from forming beneath a gate oxide of an electronic device, such as a MOS transistor or memory circuit. The present invention is therefore a method of fabricating an electronic device and a resulting electronic device.

An exemplary method includes forming a pad oxide layer on a substrate, forming a silicon nitride layer over the pad oxide layer, and forming a top oxide layer over the silicon nitride layer. A first dopant region is then formed (i.e., by diffusion or implantation) in a first portion of the substrate. Subsequent to forming the first dopant region, a first portion of the top oxide layer is removed. A remaining portion of the top oxide layer is used to align a second dopant mask. A second dopant region is then formed in a second portion of the substrate in proximity to the first dopant region. At least one annealing step is performed to drive-in at least one of the dopants but the diffusion of oxygen to the surface of the substrate during the annealing step is limited by the silicon nitride layer. The silicon nitride layer thereby assures that the uppermost surface of the silicon is substantially planar in an area proximate to both the dopant regions after the at least one annealing step.

The resulting electronic device, in one exemplary embodiment, includes a substrate, for example, in a silicon-on-insulator (SOI) arrangement, with a first portion of the substrate having a first dopant region and a second portion of the substrate having a second dopant region. An area proximate to both the first and second dopant regions forms a channel with a topmost portion of the channel being coincident with an uppermost surface of the substrate. The uppermost surface is also substantially planar and continuous in an area proximate to the channel. Here, the silicon nitride layer used during fabrication has effectively eliminated or greatly reduced a diffusion of molecular or atomic oxygen through the nitride to the silicon, thereby limiting oxidation and the resulting silicon consumption. The oxidation process causes the discontinuous surface of the prior art. The electronic device further includes at least one transistor. The transistor is fabricated substantially on the substrate and has a gate area, a drain area, and a source area. The source and drain areas each include one of the dopant regions. The gate area includes a gate oxide located over the channel area. The gate oxide of the electronic device is characterized as substantially planar and continuous in the channel area.

BRIEF DESCRIPTION OF THE DRAWINGS

FIGS. 2A-2M show various cross-sectional views of an MOS device fabricated using exemplary fabrication techniques of the present invention.

DETAILED DESCRIPTION OF THE INVENTION

Fick's law of diffusion provides an overview of applicable physics and governing equations employed in diffusion processes to fully appreciate an impact of the present invention. Fick's law governs how quickly and to what depth a chemical species will diffuse into a substrate (e.g., a silicon wafer). The first derivative of the substrate depth, x, applied to Fick's first law yields a volume concentration, N [atoms/cm$^3$], as a function of time, t [sec], and depth, x [micrometers], from a face of the substrate:

$$\frac{d(\text{flux})}{dx} = -\left(D\frac{\partial^2 (N(x,t))}{\partial x^2}\right)$$

Substituting the continuity equation into this derivative produces Fick's second law of diffusion:

$$\frac{\partial (N(x,t))}{\partial t} = D\frac{\partial^2 (N(x,t))}{\partial x^2}$$

Assuming a semi-infinite substrate thickness, a given set of boundary conditions are introduced to solve Fick's second law. The semiconductor-infinite substrate thickness is a reasonable assumption considering that a species will typically diffuse perhaps only 0.1% of a total thickness of the substrate into a face of the substrate. Therefore, for a semi-infinite substrate thickness, we can further assume $$\lim(N(x,t)) \to 0$$

For initial conditions at time t=0 and x=0, a given surface concentration of impurity atoms, Q [atoms/cm$^2$], exists. Therefore, for a given diffusion coefficient, D:

$$N(x,t) = \frac{Q}{2\sqrt{\prod Dt}} \cdot e^{-(x/2\sqrt{Dt})^2}$$

The diffusion coefficient itself is a function of a diffusion temperature, diffusion material, and species diffused into or through. Therefore, a particular elemental or molecular material will diffuse at different rates through different materials.

Figure 2A:
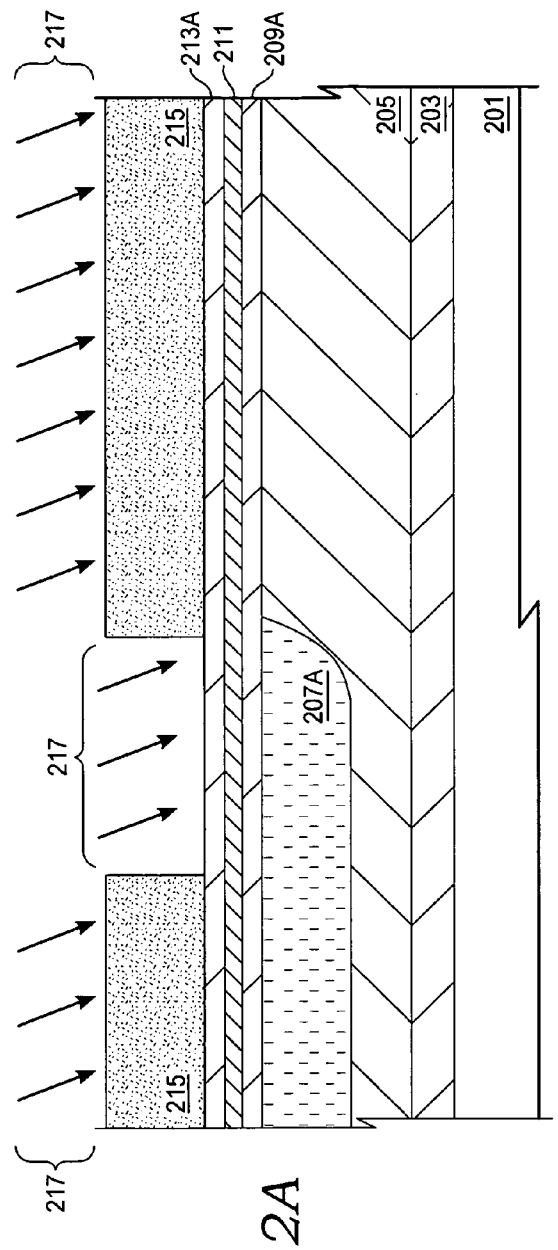

With reference to FIG. 2A, beginning processes of an exemplary embodiment of the present invention utilize a silicon-on-insulator (SOI) technique and include a substrate 201, a dielectric isolation layer 203, and an SOI layer 205. In a specific exemplary embodiment, the substrate 201 is a silicon wafer. Alternatively, the substrate 201 could be another elemental group IV semiconductor or a compound semiconductor (e.g., groups III-V or II-VI). The substrate 201 may alternatively be a non-semiconductor, such as a photomask blank.

A pad silicon dioxide layer 209A is either thermally grown or deposited (e.g., by chemical vapor deposition (CVD) or atomic layer deposition (ALD)) on the SOI layer 205. A first silicon nitride layer 211 is deposited over the pad silicon dioxide layer 209A and an additional first silicon dioxide layer 213A is grown or deposited on the first silicon nitride layer 211. In a specific embodiment, the top oxide layer 213A is silicon dioxide grown by a pyrolitic oxidation of tetraethylorthosilane (TEOS). Although silicon nitride (i.e., $Si_3N_4$) is referred to in this exemplary embodiment, a skilled artisan will realize that a non-stoichiometric form of silicon nitride (e.g., $Si_xN_y$ or $Si_xN_yH_z$) will also function for another exemplary method of the present invention. Additionally, other non-stoichiometric nitrides, for example oxy-nitride ($Si_xN_yO_z$), will produce similar results. The combination of the pad silicon dioxide layer 209A, the first silicon nitride layer 211, and the first silicon dioxide layer 213A form an ONO structure. In a specific exemplary embodiment, the pad silicon dioxide layer 209A is approximately 100 Å to 400 Å thick, the first silicon nitride layer 211 is approximately 80 Å to 300 Å thick, and the first silicon dioxide layer 213A is approximately 40 Å to 400 Å thick.

A first patterned and etched photoresist layer 215 provides a mask for an ion implantation step. In a specific embodiment, a concentration of phosphorus atoms 217 forms an n-drain drift region 207A. A skilled artisan will recognize that other doping techniques, such as diffusion, as well as other dopant types may also be readily employed to produce an nwell area.

Figure 2B:
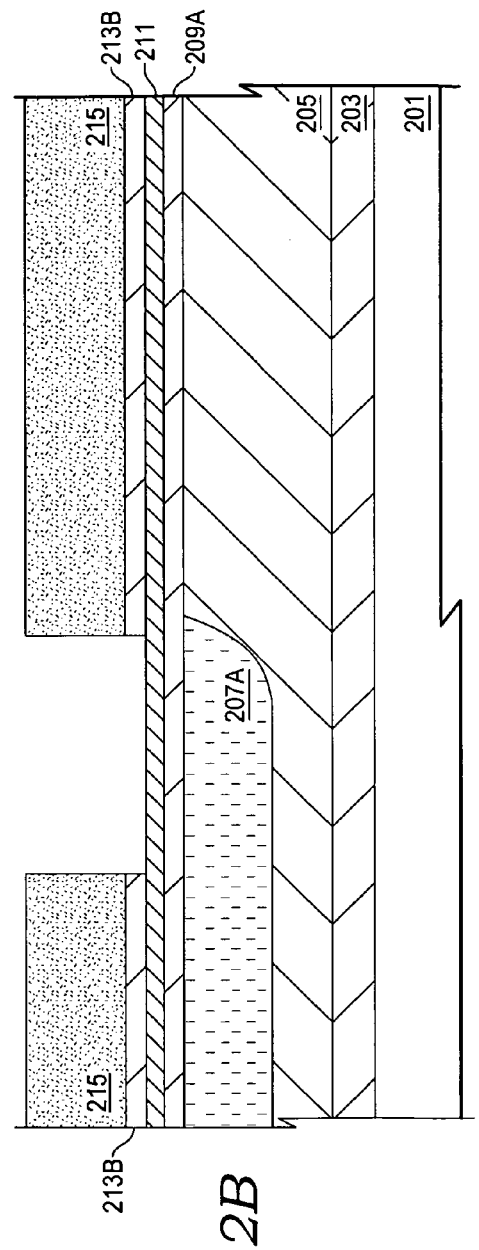

In FIG. 2B, the first etched photoresist layer 215 also allows an underlying portion of an etched first silicon dioxide layer 213B to remain unetched. A portion of the former first silicon dioxide layer 213A has been etched, for example, by a buffered oxide etch (BOE). A subsequent drive-in operation is performed, further diffusing the implanted dopant material to form a driven-in n-drain drift region 207B (FIG. 2C) into the SOI layer 205.

Figure 1A:
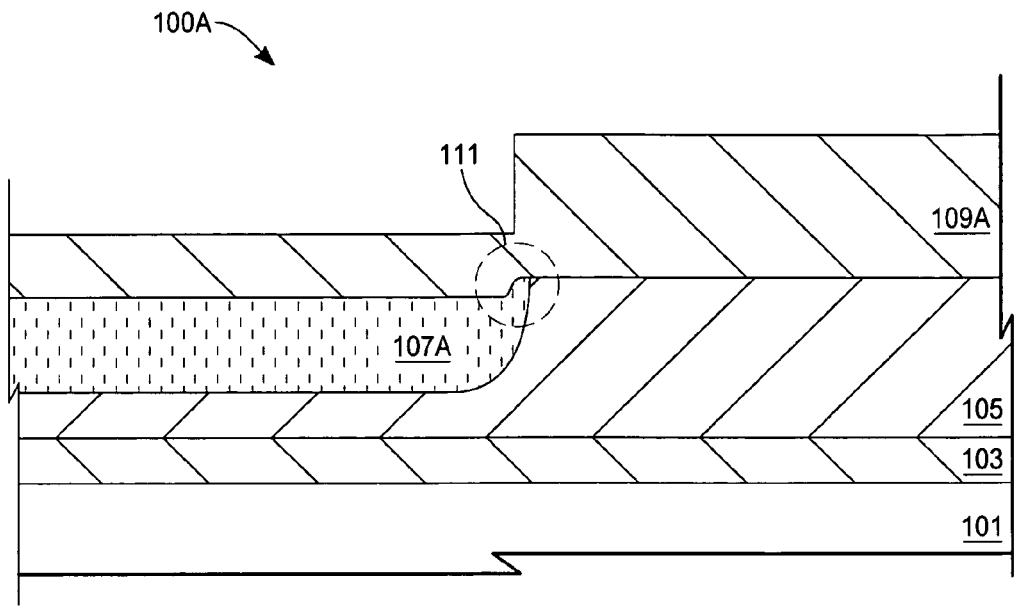
FIG. 1A is a cross-sectional view after initial processing steps of a gate region in a prior art MOS device.
Figure 1B:
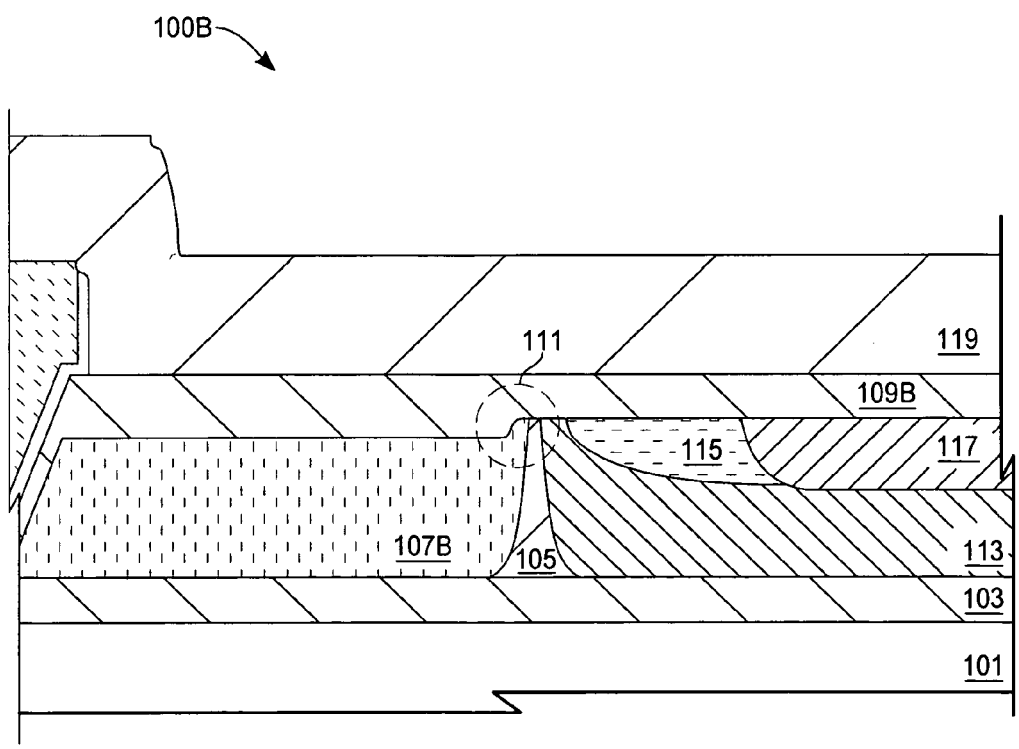
FIG. 1B is a cross-sectional view after subsequent processing steps of a gate region in the prior art MOS device of FIG. 1A.

The drive-in operation also anneals the silicon, thereby reducing any lattice damage caused by the implantation process. However, notice the planarity of an uppermost surface of the SOI layer 205 has not been affected. The silicon step 111 of the prior art (FIGS. 1A and 1B) has been eliminated. The channel surface quality of the MOS device is thereby improved and electrical properties of the device are enhanced. Reducing diffusion of oxygen atoms or oxygen molecules through the first silicon nitride layer 211 has prevented or greatly reduced any oxide growth, and a concomitant consumption of silicon, at an uppermost surface of the driven-in n-drain drift region 207B. The silicon surface is effectively sealed during the drive-in/anneal step limiting surface damage, silicon consumption, and/or outgassing of the dopant species. Additionally, the first silicon nitride layer 211 serves an advantage in preventing contamination (e.g., particulate-based microcontamination or chemical/heavy metal contamination) from forming on a channel area by sealing off underlying active areas.

Considering the governing equations presented earlier, one can calculate that a ratio of diffusion of oxygen through silicon dioxide versus silicon nitride is approximately 600:1 at 1000° C. Therefore, silicon oxidation is significantly reduced and little, if any, silicon underlying the silicon nitride layer is consumed in the form of silicon dioxide production. (A skilled artisan will recognize that thermally-produced silicon dioxide consumes approximately 44% of the underlying silicon layer.) A remaining portion of the etched first silicon dioxide layer 213B also aids in alignment of a photoresist implant mask (not shown) to form a subsequently formed pwell 219 and a threshold implant 221 (FIG. 2D).

Alignment techniques are known to a skilled artisan and include keeping an edge of at least one of the film layers abrupt enough (i.e., having a near-normal edge slope) such that illumination from a photolithographic tool (e.g., a stepper or scanner) is scattered back onto the tool. Employing this technique, even a small edge of tens of Angstroms in height causes a coincident edge on a surface of a photoresist layer (assuming, of course, that the photoresist layer is not removed from the region of alignment prior to alignment and exposure). Sensitive detectors locate parallel edges running in both lateral directions using the backscattered illumination and then calculate a location on the substrate on which to flash or project an image of the photomask onto the surface. Other alignment techniques use etched gratings placed on the substrate near a start of fabrication operations. The etched gratings are frequently referred to as "zero-marks." Layers are then registered to each other indirectly using the zero-marks and adjusting, only when necessary, a location of the flash depending on any distortion on the surface of the substrate or distortion in the backscattered image of the zero-mark. Additional exemplary alignment techniques are described in detail, infra.

With continued reference to FIG. 2D, the pwell 219 (forming a body of the MOS device) has been implanted and driven-in in a fashion similar to the steps just described for forming the driven-in n-drain drift region 207B. Prior to its removal, the first silicon nitride layer 211 (not shown in FIG. 2D) continued to seal the silicon surface during the drive-in step of the pwell 219, thus continuing to eliminate or prevent any significant silicon oxidation. The remaining portion of the etched first silicon dioxide layer 213B and the first silicon nitride layer 211 of FIG. 2C are etched (for example, with a wet-etch such as hydrofluoric acid (such as contained in a standard BOE) or orthophosphoric acid, or with a dry-etch, such as a reactive-ion etch (RIE)). The pad silicon dioxide layer 209A may either be etched and replaced by a gate silicon dioxide layer 209B, or left intact to serve as a gate oxide. Either way, techniques for partially or fully etching and regrowing gate oxides are known in the art. Alternatively, other types of dielectric materials, including advanced high-contract dielectric materials, may be used to form a gate dielectric layer. A first polysilicon layer 223A is formed over the gate silicon dioxide layer 209B.

Figure 2E:
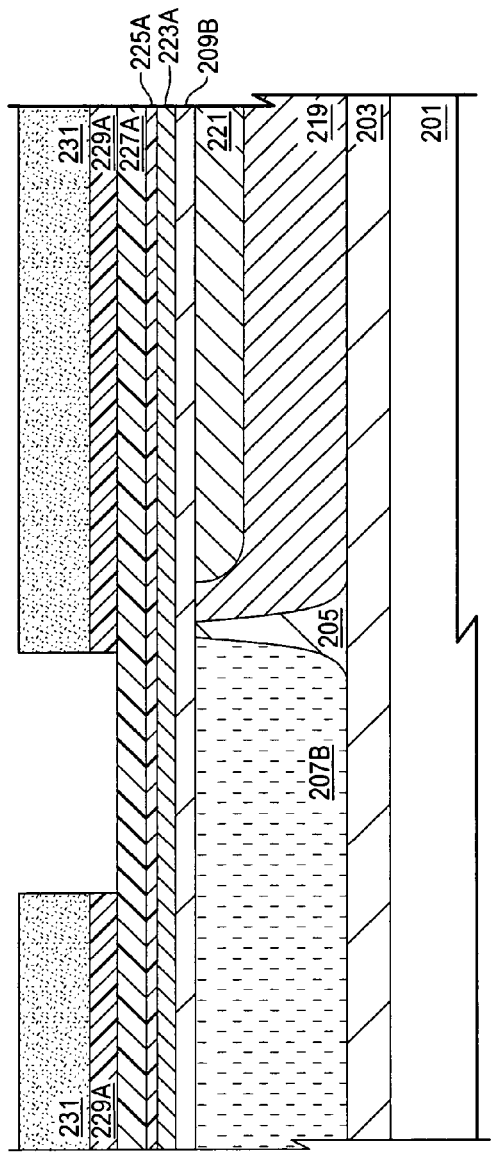

With reference to FIG. 2E, fabrication of an active stack continues with a second silicon dioxide layer 225A thermally grown or deposited over the first polysilicon layer 223A, followed by a second silicon nitride layer 227A. As shown, a third silicon dioxide layer 229A has already been etched by use of a second patterned and etched photoresist layer 231 using techniques already described. The third silicon dioxide layer 229A will serve as a hard-mask for etching the remainder of the stack and etching into the SOI layer 205 to form one or more shallow trench isolation (STI) features, described infra. In a specific exemplary embodiment, the first polysilicon layer 223A is deposited to a thickness of approximately 1200 Å, the second silicon dioxide layer 225A is either grown or deposited to approximately 120 Å in thickness, the second silicon nitride layer 227A is deposited to about 1200 Å in thickness, and the third silicon dioxide layer 229A is a high-density plasma (HDP) enhanced deposition approximately 2000 Å thick. In this embodiment, the third silicon dioxide layer 229A has been dry-etched, thus preserving relatively vertical sidewalls.

Figure 2F:
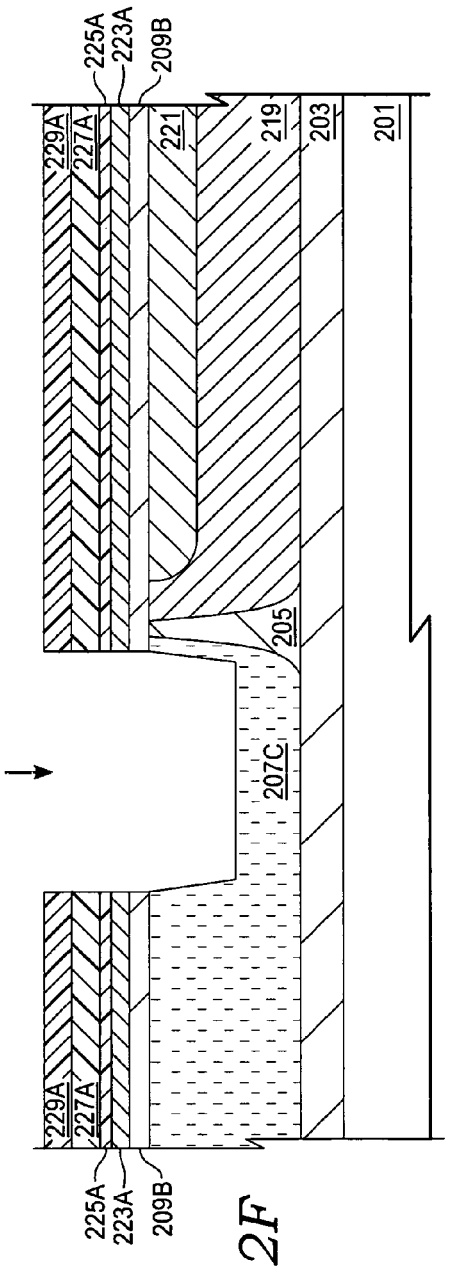
Figure 2G:
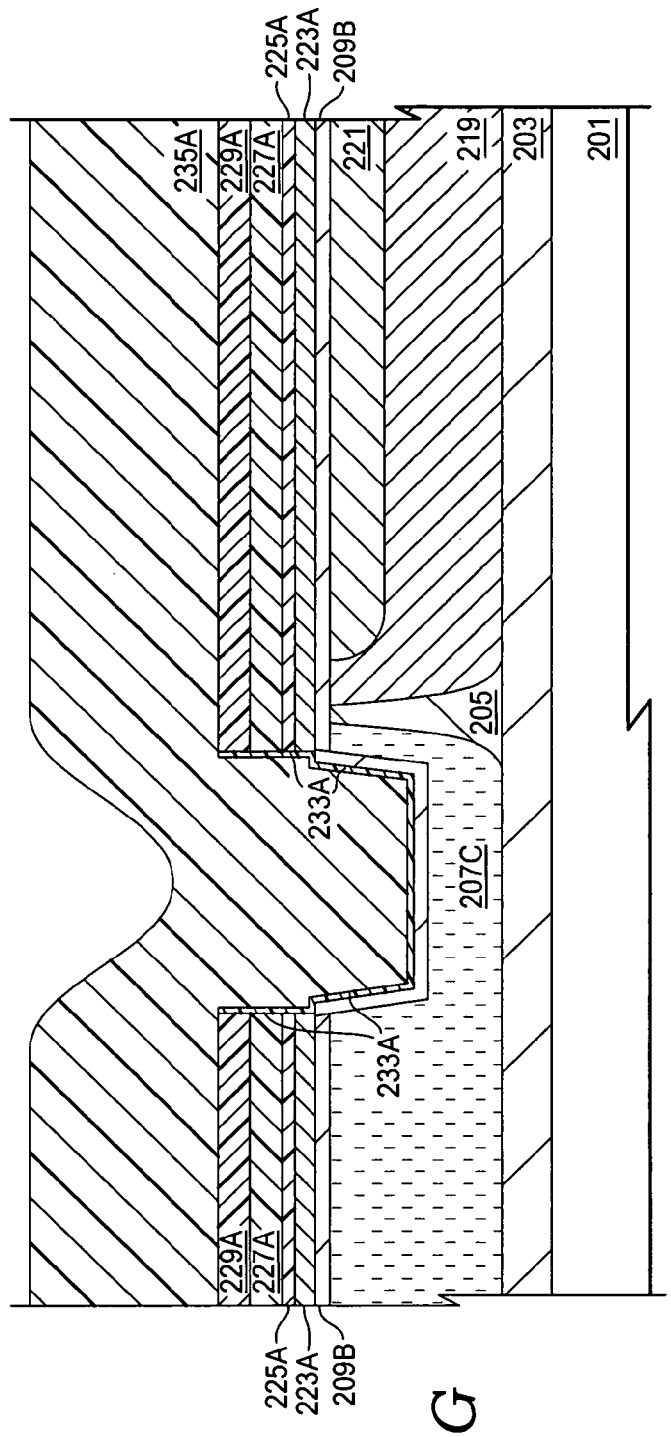

With reference to FIG. 2F, the active stack previously formed has been etched along with a portion of the driven-in n-drain drift region 207B contained in the SOI layer 205. Etching a shallow trench 232 by creating an etched driven-in n-drain drift region 207C may be performed by either dry-etch (e.g., RIE with a fluorine rich plasma (e.g., $SF_6$)) or wet-etch (for example, with potassium hydroxide (KOH) or tetra-methyl ammonium hydroxide (TMAH)) techniques. In FIG. 2G, a liner dielectric 233A is formed on sidewalls and bottom areas of the shallow trench 232 by, for example, a 200 Å TEOS deposition. A blanket shallow trench fill layer 235A is then conformally deposited. The shallow trench fill layer 235A may be, for example, an HDP oxide deposited to approximately 900 nm in thickness, although an actual thickness is at least partially dependent an overall height of the combined shallow trench and active stack.

Figure 2H:
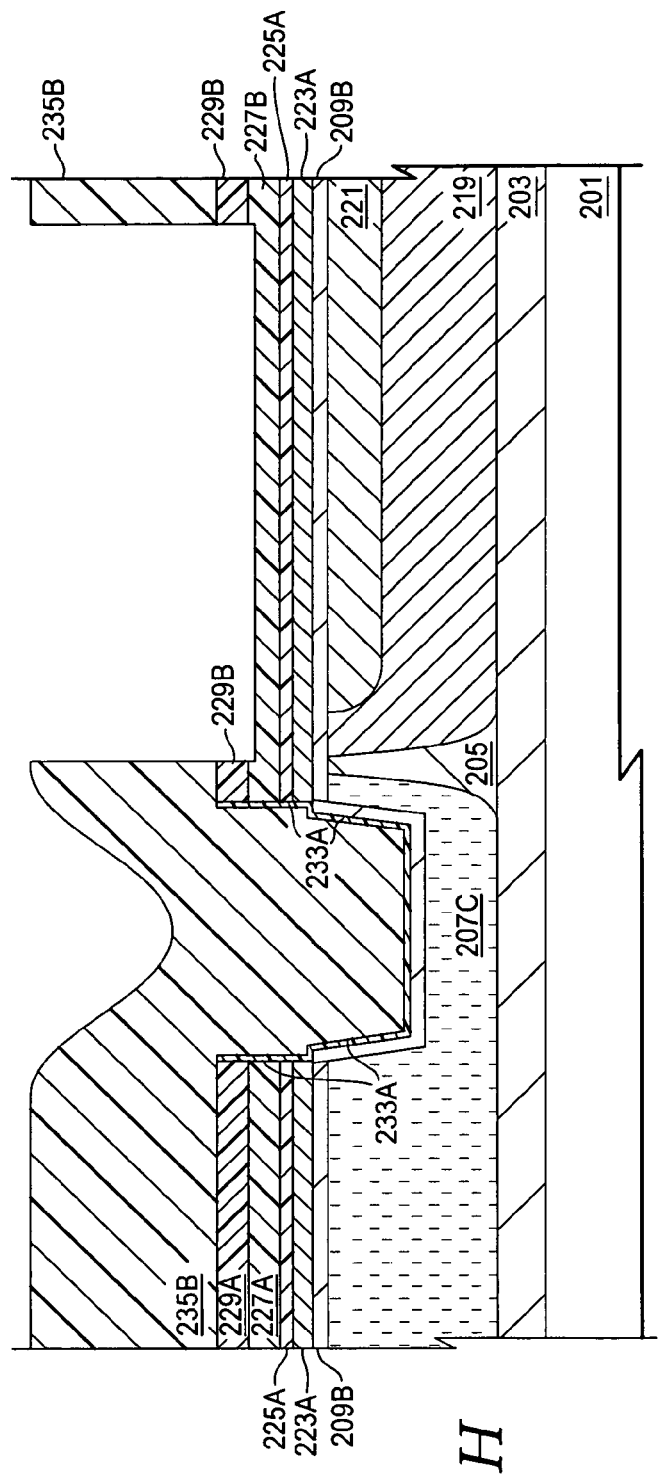

In FIG. 2H, a portion of the shallow trench fill layer 235A is etched, thus forming an etched shallow trench fill layer 235B. The etched shallow trench fill layer 235B acts as a mask for producing an etched third silicon dioxide layer 229B and a partially etched second silicon nitride layer 227B. Note that etching into the silicon nitride layer 227A is not a necessary step but may occur when certain etchants are used (e.g., a non-selective RIE step).

Figure 2K:
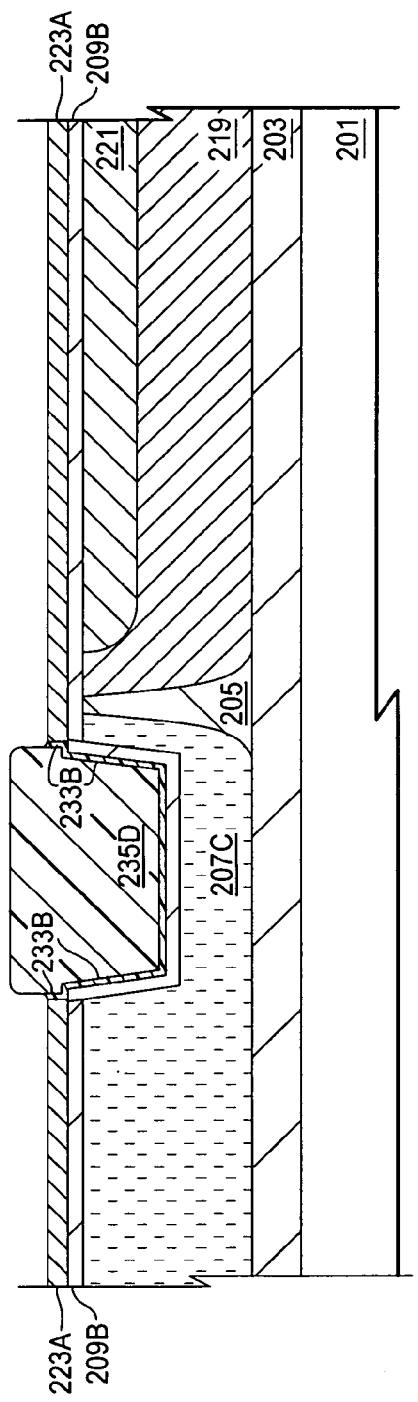
Figure 2L:
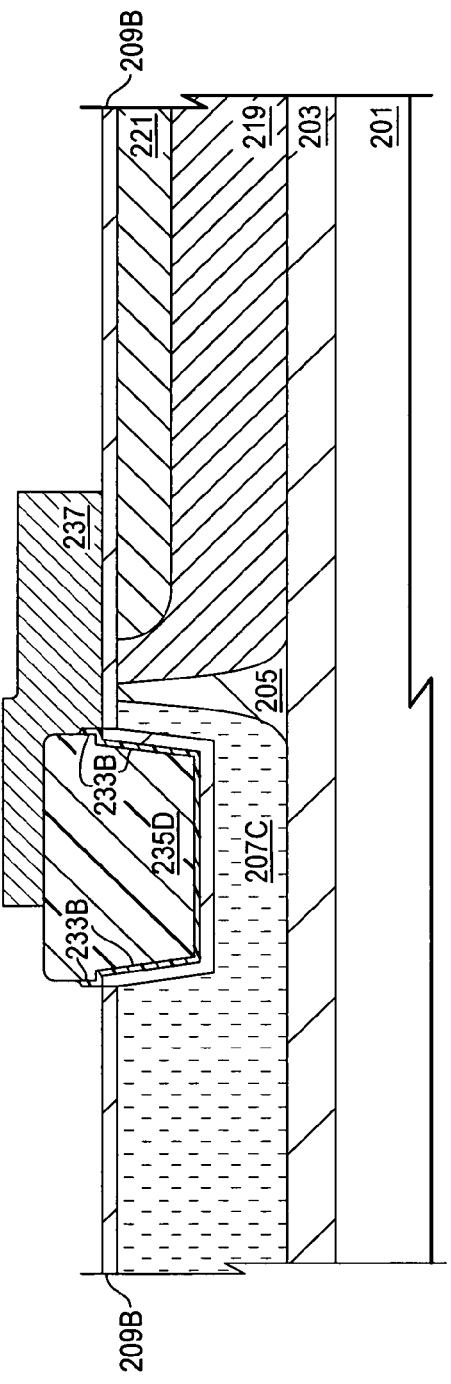

A planarization step of FIG. 2I (e.g., chemical mechanical planarization (CMP)) uses the partially etched second silicon nitride layer 227B as an etch stop, thus producing a relatively planarized uppermost portions of a planarized shallow trench fill layer 235C and a planarized second silicon nitride layer 227C. (A degree of micro-planarity depends upon relative hardness of proximal dissimilar materials and is not significant for this exemplary embodiment.) In FIG. 2J, the planarized second silicon nitride layer 227C is removed (for example, by a hot phosphoric acid bath). A BOE dip, FIG. 2K, produces a brief isotropic etch thus rounding top corners of the STI fill, producing a rounded shallow trench fill 235D. The rounded corners provide more uniform and predictable electric field effects. The BOE etch further produces an etched liner dielectric layer 233B. Following the BOE etch step, a polysilicon blanket layer (not shown) is deposited, patterned, and etched (FIG. 2L), producing a polysilicon gate 237. In a specific exemplary embodiment, the polysilicon layer may be deposited by CVD to a depth of approximately 200 nm.

With reference to FIG. 2M, a gate liner dielectric 239 is formed, surrounding the polysilicon gate 237. For example, the gate liner dielectric may be chosen to be a silicon dioxide layer, thermally grown to surround the polysilicon gate 237. Following fabrication of the gate liner dielectric 239, a lightly doped drain region 241 is either implanted or diffused (using methods known in the art and described elsewhere herein). The combination of the polysilicon gate 237 surrounded by the gate liner dielectric 239 allows the lightly doped drain region to be self-aligned with one side of the gate structure.

With continued reference to FIG. 2M and following fabrication of the lightly doped drain region 241, a blanket dielectric spacer layer (not shown) is formed, for example, by CVD. In a specific exemplary embodiment, the dielectric spacer layer is chosen to be chemically dissimilar to underlying dielectric film layers (e.g., the gate silicon dioxide layer 209B, the rounded shallow trench fill 235D, and the gate liner dielectric 239). For example, if the gate silicon dioxide layer 209B, the rounded shallow trench fill 235D, and the gate liner dielectric 239 are all chosen to be comprised of silicon dioxide, then the dielectric spacer layer may be chosen to be silicon nitride. In this way, an etchant which is selective between silicon dioxide and silicon nitride allows the underlying silicon dioxide layers to act as an etch stop. Thus, the selective etchant is used to etch the dielectric spacer layer without substantially affecting an integrity of any other layer. Etching of the spacer layer is performed such that substantially all horizontal surfaces (i.e., those parallel to a face of the substrate) are etched while leaving surfaces that are essentially vertical substantially intact. Such etches are accomplished by, for example, a selective reactive ion etch. The vertical etch then leaves a dielectric spacer 243.

A "width" (i.e., a measurement made lateral to the face of the substrate) of the spacer 243 is dependent upon both a thickness of the deposited spacer layer and a step-height over which the deposited spacer layer is deposited. Since the spacer 243 forms next to a given feature (here the feature is the polysilicon gate structure), the spacer 243 is thereby self-aligned with the feature and underlying features. Further, the spacer 243 allows an etch or alignment step surrounding the given feature to be below a photolithographic limit of resolution since the etch or alignment is now based merely on a combined thickness, "t," of the polysilicon gate 237 and the gate liner dielectric 239 (i.e., a step-height of any proximate structure formed by these layers).

The spacer 243 provides a self-aligned mask to locate a source dopant region 245A. A drain dopant region 245B is located on a side of the polysilicon gate 237 distal to the source dopant region 245A.

Importantly, a comparison of the silicon step 111 of the prior art (FIGS. 1A and 1B) with a similar channel area portion 247 of this embodiment of the present invention indicates a lack of the silicon step in the channel area potion 247. The first silicon nitride layer 211 (FIGS. 2A-2C) has completely eliminated or greatly reduced any silicon step, thus allowing a continuous channel area resulting in a superior gate oxide dielectric quality, superior mobility of carriers in the channel area, and superior reliability and lifetime of any MOS or similar electronic device fabricated using the present invention.

The electrical device of FIG. 2M is completed by fabrication steps (not shown) known to one of skill in the art. These steps include, for example, depositing and forming salicide, depositing a thick dielectric overlayer, CMP of the overlayer, forming contacts within the overlayer, and filling contacts with tungsten plugs.

In the foregoing specification, the present invention has been described with reference to specific embodiments thereof. For example, various doping processes are described in terms of implants. A skilled artisan will realize that another doping process, such as diffusion, may be substituted for the implant process. Also, various layers are defined as being comprised of a given material, for example, silicon dioxide. A skilled practitioner will realize that another dielectric material may often be substituted. For example, a silicon dioxide layer may be interchanged with a silicon nitride layer as long as select adjacent dielectric layers have different etch rates (e.g., a high selectivity wet-etch process will etch silicon dioxide more rapidly than silicon nitride or vice versa) and at least one of the layers has an oxygen diffusion rate that is much lower than silicon dioxide. Also, various types of silicon dioxide may be used even though the characteristics are all somewhat similar to each other (e.g., dielectric breakdown or permittivity). Thus, silicon dioxide layers formed by thermal growth, chemical vapor deposition, or TEOS techniques may be considered to be similar for an application of the present invention. Additionally, other substrates may be substituted for the SOI structure presented, such as separation by implantation of oxygen (SIMOX wafers), a thinned and bonded wafer (e.g., silicon, silicon-germanium, etc.), or a polysilicon deposited over an insulating substrate followed by an anneal step (e.g., rapid thermal annealing (RTA) or excimer laser annealing (ELA)) will function with the various exemplary embodiments described herein. It will, therefore, be evident that various modifications and changes can be made thereto without departing from the broader spirit and scope of the present invention as set forth in the appended claims. The specification and drawings are, accordingly, to be regarded in an illustrative rather than a restrictive sense.

What is claimed is:

1. A method of fabricating an electronic device, the method comprising:
   forming a first dielectric layer on an uppermost surface of a substrate;
   forming a second dielectric layer over the first dielectric layer; the second dielectric layer having a lower diffusivity rate of oxygen than a diffusivity rate of oxygen through the first dielectric layer;
   forming a third dielectric layer over the second dielectric layer, the third dielectric layer being of a same or similar dielectric as the first dielectric layer;
   forming a first dopant region in a first portion of the substrate;
   subsequent to forming the first dopant region, removing a first portion of the third dielectric layer, the first portion having been located substantially over the first dopant region;
   using a portion of the third dielectric layer which remains after the first portion is removed to align a second dopant mask;
   forming a second dopant region in a second portion of the substrate in proximity to the first dopant region;
   performing at least one annealing step to drive-in at least one of the dopants, the diffusion of oxygen to the surface of the substrate during the annealing step being limited by the second dielectric layer.

2. The method of claim 1 wherein the substrate is comprised of a semiconducting material.

3. The method of claim 1 wherein the substrate is silicon-on-insulator.

4. The method of claim 1 wherein the first dielectric layer is comprised of silicon dioxide.

5. The method of claim 1 wherein the second dielectric layer is comprised of silicon nitride.

6. The method of claim 1 wherein the third dielectric layer is comprised of silicon dioxide.

7. The method of claim 1 further comprising selecting the second dielectric layer further to be of a material that may be selectively etched at a different rate from the first dielectric layer.

8. The method of claim 7 wherein an etching step is used to remove the portion of the third dielectric layer, the etching step being performed using an etchant with a high selectivity ratio between the third dielectric layer and the second dielectric layer.

9. The method of claim 1 wherein diffusivity rate of the second dielectric layer is selected so as to limit a diffusion of oxygen to the uppermost side of the substrate.

10. The method of claim 1, further comprising:
    removing the remaining portion of the third dielectric layer;
    removing the second dielectric layer;
    removing the first dielectric layer; and
    forming a gate oxide layer on the uppermost surface of the substrate, the substrate being comprised of silicon.

11. The method of claim 10 wherein an upper surface of the gate oxide layer and an area of the silicon underlying the gate oxide are each substantially planar.

12. The method of claim 1 wherein the first dielectric layer forms a gate oxide.

13. The method of claim 1, further comprising:
    forming a polysilicon gate over at least a portion of the first dopant region; and
    forming spacers on sidewalls of the polysilicon gate.

14. The method of claim 13 wherein the step of forming spacers on the sidewalls of the polysilicon gate comprises:
    forming a polysilicon gate dielectric layer on exposed portions of the polysilicon gate;
    forming a spacer dielectric film layer over the polysilicon gate dielectric layer; and
    etching regions of the spacer dielectric film layer that are essentially parallel to the surface of the substrate while leaving regions of the spacer dielectric film layer that are essentially perpendicular to the first surface of the substrate, thus creating spacers.

15. The method of claim 14 wherein the step of etching regions of the spacer dielectric film layer is performed by a reactive ion etch (RIE).

16. The method of claim 14 wherein the spacer dielectric film layer is chosen such that a chemical etching property of the spacer dielectric film layer is dissimilar to a chemical etching property of the polysilicon gate dielectric layer.

17. The method of claim 13 wherein the spacers are used as self-aligned masks to form a third dopant region.

18. The method of claim 1 wherein the second dielectric layer is selected to prevent contamination from forming on the uppermost surface of the substrate.

19. A method of fabricating an electronic device, the method comprising:
    forming a pad oxide layer on an uppermost surface of a substrate;
    forming a silicon nitride layer over the pad oxide layer; the silicon nitride layer sealing the substrate against a diffusion of oxygen to the uppermost side of the substrate;
    forming a top oxide layer over the silicon nitride layer;
    forming a first dopant region in a first portion of the substrate;
    subsequent to forming the first dopant region, removing a first portion of the top oxide layer, the first portion having been located substantially over the first dopant region;
    using a portion of the top oxide layer which remains after the first portion is removed to align a second dopant mask;
    forming a second dopant region in a second portion of the substrate in proximity to the first dopant region;
    performing at least one annealing step at an elevated temperature to drive-in at least one of the dopants, the diffusion of oxygen to the surface of the substrate during the annealing step being limited by the silicon nitride layer thereby assuring that the uppermost surface of the substrate is substantially planar in an area between the dopant regions after the at least one annealing step.

20. The method of claim 19 wherein the substrate is comprised of a semiconducting material.

21. The method of claim 19 wherein the substrate is silicon-on-insulator.

22. The method of claim 19 wherein an etching step is used to remove the portion of the top oxide layer, the etching step being performed using an etchant with a high selectivity ratio between the top oxide layer and the silicon nitride layer.

23. The method of claim 19, further comprising:
    removing the remaining portion of the top oxide layer;
    removing the silicon nitride layer;
    removing the pad oxide layer; and
    forming a gate oxide layer on the uppermost surface of the substrate, the substrate being comprised of silicon.

24. The method of claim 23 wherein an upper surface of the gate oxide layer and an area of the silicon underlying the gate oxide are each substantially planar.

25. The method of claim 19 wherein the pad oxide layer forms a gate oxide.

26. The method of claim 19, further comprising:
   forming a polysilicon gate over at least a portion of the first dopant region; and
   forming spacers on sidewalls of the polysilicon gate.

27. The method of claim 26 wherein the step of forming spacers on the sidewalls of the polysilicon gate comprises:
   forming a polysilicon gate silicon dioxide layer on exposed portions of the polysilicon gate;
   forming a nitride spacer dielectric film layer over the polysilicon gate silicon dioxide layer; and
   etching regions of the nitride spacer dielectric film layer that are essentially parallel to the surface of the substrate while leaving regions of the nitride spacer dielectric film layer that are essentially perpendicular to the first surface of the substrate, thus creating spacers.

28. The method of claim 27 wherein the step of etching regions of the spacer dielectric film layer is performed by a reactive ion etch (RIE).

29. The method of claim 26 wherein the spacers are used as self-aligned masks to form a third dopant region.

30. The method of claim 19 wherein the second dielectric layer is selected to prevent contamination from forming on the uppermost surface of the substrate.

* * * * *

UNITED STATES PATENT AND TRADEMARK OFFICE
CERTIFICATE OF CORRECTION

PATENT NO. : 7,407,851 B2 Page 1 of 1
APPLICATION NO. : 11/386316
DATED : August 5, 2008
INVENTOR(S) : Miller et al.

It is certified that error appears in the above-identified patent and that said Letters Patent is hereby corrected as shown below:

In column 5, line 8, delete "pyrolitic" and insert -- pyrolytic --, therefor.

Signed and Sealed this

Eleventh Day of November, 2008

JON W. DUDAS
*Director of the United States Patent and Trademark Office*